(12) United States Patent
Ono

(10) Patent No.: US 9,229,205 B2
(45) Date of Patent: Jan. 5, 2016

(54) PROJECTION OPTICAL SYSTEM, EXPOSURE APPARATUS, AND METHOD OF MANUFACTURING DEVICE

(75) Inventor: Fumiyasu Ono, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 665 days.

(21) Appl. No.: 13/592,444

(22) Filed: Aug. 23, 2012

(65) Prior Publication Data

US 2013/0050667 A1    Feb. 28, 2013

(30) Foreign Application Priority Data

Aug. 24, 2011    (JP) .................. 2011-183079

(51) Int. Cl.
*G03B 27/54* (2006.01)
*G02B 17/06* (2006.01)
*G03F 7/20* (2006.01)

(52) U.S. Cl.
CPC ........ *G02B 17/0615* (2013.01); *G03F 7/70233* (2013.01); *G03F 7/70275* (2013.01)

(58) Field of Classification Search
CPC ............ G03F 7/70233; G03F 7/70275; G02B 17/0615
USPC ..................................... 355/67, 45
See application file for complete search history.

(56) References Cited

U.S. PATENT DOCUMENTS

| | | | | |
|---|---|---|---|---|
| 5,298,939 A * | 3/1994 | Swanson | ............ | G03F 7/70275 355/30 |
| 5,585,972 A * | 12/1996 | Markle | .................. | G02B 13/26 359/732 |
| 5,959,784 A * | 9/1999 | Seki et al. | ...................... | 359/663 |
| 6,552,775 B1 * | 4/2003 | Yanagihara et al. | ............ | 355/55 |
| 7,470,033 B2 | 12/2008 | Takahashi | | |
| 8,520,188 B2 * | 8/2013 | Fukui | .................... | G03F 7/7005 355/53 |

FOREIGN PATENT DOCUMENTS

| | | |
|---|---|---|
| EP | 0723173 B1 | 11/2003 |
| EP | 2000840 A2 | 12/2008 |
| EP | 2136231 A1 | 12/2009 |
| JP | 0757986 A | 3/1995 |

(Continued)

OTHER PUBLICATIONS

Official Action issued in KR10-2012-0089278 mailed Aug. 26, 2014.

(Continued)

*Primary Examiner* — Deoram Persaud

(74) *Attorney, Agent, or Firm* — Rossi, Kimms & McDowell LLP

(57) ABSTRACT

A projection optical system including a unity magnification reflecting optical system which forms an intermediate image of an object positioned on an object plane. The reflecting optical system includes a first mirror which reflects light emitted from the object plane, an optical system which reflects the light from the first mirror, and a second mirror which reflects the light from the optical system toward a forming position of the intermediate image. The first mirror, the second mirror and the optical system are positioned so as to satisfy a condition in which a distance between a position of reflection of the light on the second mirror and the forming position of the intermediate image is smaller than a distance between a position of reflection of the light on the first mirror and the object plane.

8 Claims, 4 Drawing Sheets

(56) References Cited

FOREIGN PATENT DOCUMENTS

| | | | |
|---|---|---|---|
| JP | 09293676 | A | 11/1997 |
| JP | 2001290279 | A | 10/2001 |
| JP | 2004093953 | A | 3/2004 |
| JP | 2008545153 | A | 12/2008 |
| JP | 2009158719 | A | 7/2009 |
| JP | 2011039172 | A | 2/2011 |
| KR | 100319216 | B1 | 6/2002 |
| KR | 1020080022125 | A | 3/2008 |
| KR | 10-0848523 | B1 | 7/2008 |
| KR | 1020110015397 | A | 2/2011 |

OTHER PUBLICATIONS

Japanese Office Action cited in Japanese counterpart application No. 2011-183079, dated Mar. 30, 2015.

Office Action issued in TW101127980, mailed Mar. 23, 2015. English translation provided.

Korean Office Action cited in Korean counterpart application No. KR10-2012-0089278, dated Apr. 16, 2015.

* cited by examiner

PROJECTION OPTICAL SYSTEM, EXPOSURE APPARATUS, AND METHOD OF MANUFACTURING DEVICE

BACKGROUND OF THE INVENTION

1. Field of the Invention

The present invention relates to a projection optical system, an exposure apparatus, and a method of manufacturing a device.

2. Description of the Related Art

A liquid crystal display panel has come to be generally used as a display device such as an FPD (Flat Panel Display). A liquid crystal display panel is manufactured using a photolithography method which employs an exposure apparatus. Further, with the recent increase in size of, for example, a television, an exposure apparatus compatible with such an increase in size using a plurality of projection optical systems, as described in Japanese Patent Laid-Open No. 2001-290279, has been proposed.

A method of vertically stacking two projection optical systems has been proposed to form an erected image in an exposure apparatus which uses a plurality of projection optical system. However, upon stacking two projection optical systems, the overall height of the projection optical systems rises, and the height of the exposure apparatus, in turn, rises, thus increasing the size of the exposure apparatus.

SUMMARY OF THE INVENTION

The present invention provides a projection optical system which achieves both good imaging performance and compactness.

The present invention in its one aspect provides a projection optical system including a unity magnification, first reflecting optical system which forms an intermediate image of an object positioned on an object plane, and a unity magnification, second reflecting optical system which projects the intermediate image onto an image plane, the first reflecting optical system comprising a first mirror which reflects light that is emitted from the object plane and is incident thereon upon traveling in a first direction perpendicular to the object plane, a first optical system which reflects the light from the first mirror, and a second mirror which reflects the light from the first optical system, in the first direction toward a forming position of the intermediate image, and the second reflecting optical system comprising a third mirror which reflects light that is emitted from the forming position of the intermediate image and is incident thereon upon traveling in the first direction, a second optical system which reflects the light from the third mirror, and a fourth mirror which reflects the light from the second optical system, in the first direction toward the image plane, wherein the first mirror, the second mirror, the third mirror, the fourth mirror, the first optical system, and the second optical system are positioned so as to satisfy at least one of a condition in which a distance in the first direction between a position of reflection of the light on the second mirror and the forming position of the intermediate image is smaller than a distance in the first direction between a position of reflection of the light on the first mirror and the object plane, and a condition in which a distance in the first direction between a position of reflection of the light on the third mirror and the forming position of the intermediate image is smaller than a distance in the first direction between a position of reflection of the light on the fourth mirror and the image plane.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

First Embodiment

Figure 1:
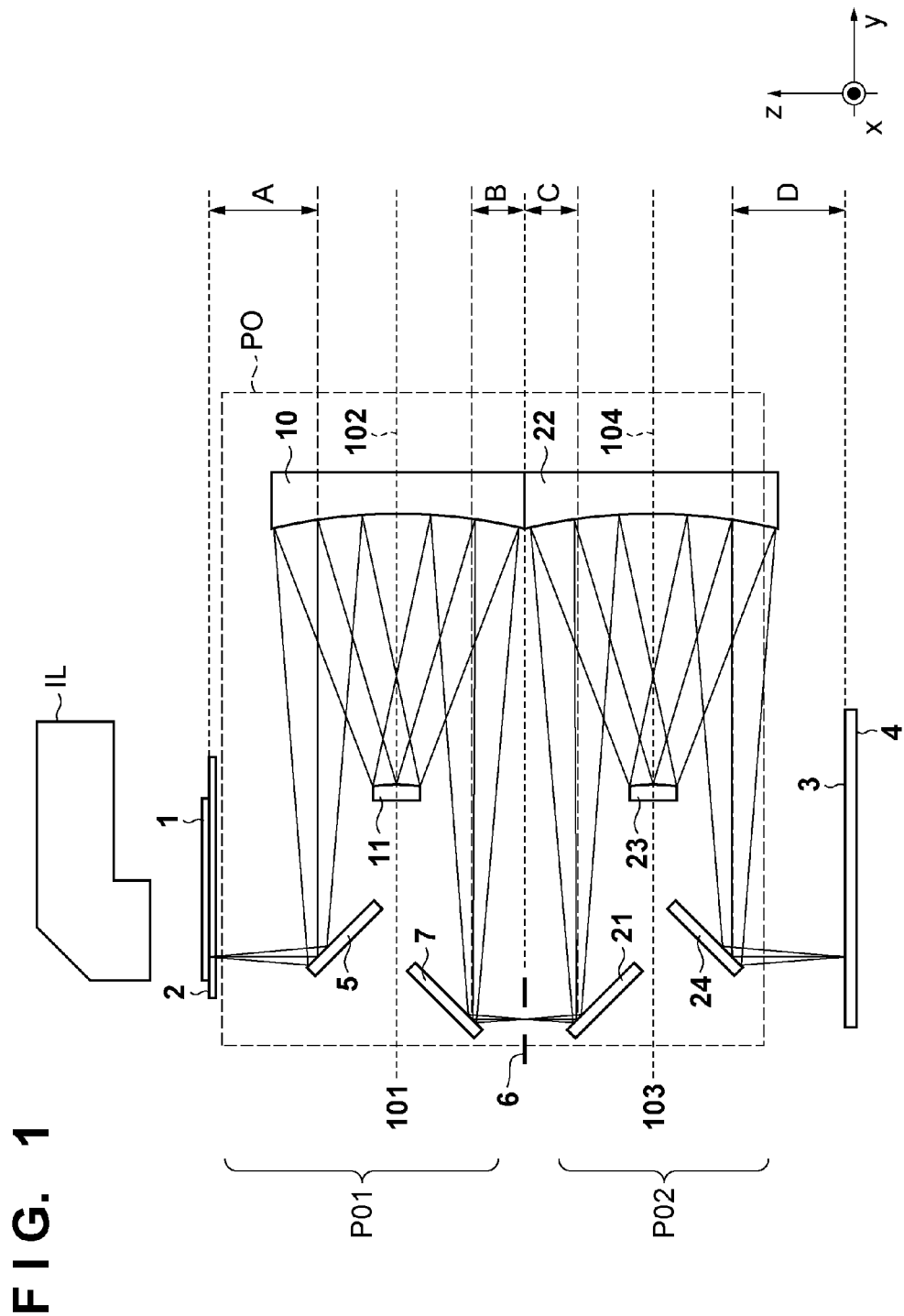
FIG. 1 is a view showing an exposure apparatus according to the first embodiment.

FIG. 1 is a view showing an exposure apparatus which exposes a substrate to light by projecting an erected image of a mask (original) onto the substrate at unity magnification (1-fold magnification) according to the first embodiment. The exposure apparatus in this embodiment includes an illumination optical system IL, a projection optical system PO, a mask 1 having a predetermined pattern drawn on it, a mask stage 2 for holding the mask 1, a substrate 3, and a substrate stage 4 for holding the substrate 3, as shown in FIG. 1. A wider region can be exposed by scanning the mask stage 2 and substrate stage 4 in the y-direction in synchronism with each other. The projection optical system PO includes a first reflecting optical system PO1 which forms an intermediate image of the mask 1, and a second reflecting optical system PO2 which forms on the substrate 3 again the intermediate image formed by the first reflecting optical system PO1. The first reflecting optical system PO1 forms an intermediate image of the mask 1 as an object positioned on an object plane parallel to a predetermined plane, and the second reflecting optical system PO2 projects the intermediate image onto an image plane parallel to the predetermined plane.

As a light source included in the illumination optical system IL, a light source optimum for a device to be manufactured can be selected from, for example, excimer lasers and high-pressure mercury lamps. To manufacture a liquid crystal display device, the g-line (436 nm), h-line (405 nm), or i-line (365 nm) of a high-pressure mercury lamp, for example, can be used as the light source. A desired pattern for manufacturing a device is drawn on the mask 1 and projected onto the substrate 3 by the projection optical system PO. A photoresist having a given sensitivity to the wavelength of the light source used in the illumination optical system IL is applied on the substrate 3, so a desired pattern is formed on the substrate 3 upon a development process.

The first reflecting optical system PO1 includes a first plane mirror 5, first optical system, and second plane mirror 7. The first plane mirror 5 reflects light which is emitted by the object plane on the mask stage 2 and is incident on it upon traveling in a first direction (z-direction) perpendicular to this object plane. The first optical system reflects toward the second plane mirror 7 the light reflected by the first plane mirror 5. The first optical system is implemented by positioning an Offner system including a first concave mirror, first convex mirror 11, and second concave mirror in the optical path between the first plane mirror 5 and the second plane mirror 7. In the first embodiment, a pair of a first concave mirror and a second concave mirror serve as an integrated concave mirror 10. The second plane mirror 7 reflects the light from the first optical system, in the z-direction toward an intermediate image forming position 6. The intermediate image forming position 6 is optically conjugate to the mask 1. The first optical system is a unity magnification optical system.

The second reflecting optical system PO2 includes a third plane mirror 21, second optical system, and fourth plane mirror 24. The third plane mirror 21 reflects light which is emitted by the intermediate image forming position 6 and is incident on it upon traveling in the z-direction. The second optical system reflects toward the fourth plane mirror 24 the light reflected by the third plane mirror 21. The second optical system can be implemented using an Offner system including a third concave mirror, second convex mirror 23, and fourth concave mirror. In the first embodiment, a pair of a third concave mirror and a fourth concave mirror serve as an integrated concave mirror 22. The fourth plane mirror 24 reflects the light from the second optical system, in the z-direction toward the image plane on the substrate stage 4. The second optical system is a unity magnification optical system. A shape of reflecting surface of the third plane mirror 21 is not limited to flat plane. The same applies to the first plane mirror 5, the second plane mirror 7, and the fourth plane mirror 24.

A line 101-102 shown in FIG. 1 indicates the optical axis of the first optical system, which connects the centers of curvature of the first convex mirror 11 and concave mirror 10 included in the first optical system to each other. Similarly, a line 103-104 shown in FIG. 1 indicates the optical axis of the second optical system, which connects the centers of curvature of the second convex mirror 23 and concave mirror 22 included in the second optical system to each other. In the scanning exposure apparatus shown in FIG. 1, the mask stage 2 scans in the y-direction. Hence, to prevent interference between the mask stage 2 and the first concave mirror, the distance between the mask stage 2 and the first plane mirror 5 in the z-direction must be kept at a predetermined value or more. Similarly, to prevent interference among the concave mirror 22 included in the second reflecting optical system PO2, the substrate 3, and the substrate stage 4, the distance in the z-direction between the fourth plane mirror 24 included in the second reflecting optical system PO2 and the substrate 3 must be kept at a predetermined value or more.

On the other hand, no scanning stage is present between the second plane mirror 7 and the third plane mirror 21. Hence, it is possible to reduce the distance in the z-direction between the intermediate image forming position 6 and the position of light reflection on the second plane mirror 7, and that between the intermediate image forming position 6 and the position of light reflection on the third plane mirror 21. To do so, the distance in the y-direction between the position of reflection on the second plane mirror 7 and the first optical system is set larger than that between the position of reflection on the first plane mirror 5 and the first optical system. Also, the distance in the y-direction between the position of reflection on the third plane mirror 21 and the second optical system is set larger than that between the position of reflection on the fourth plane mirror 24 and the second optical system. This makes it possible to reduce the distance between the second plane mirror 7 and the intermediate image forming position 6 in the z-direction while the distance between the mask stage 2 and the first plane mirror 5 in the z-direction remains the same. As a result, the distance between the optical axis 101-102 of the first optical system and the intermediate image forming position 6 can be set smaller than that between the optical axis 101-102 of the first optical system and the mask 1. The same is true for the second reflecting optical system PO2, so the third plane mirror 21 is shifted in the -y-direction relative to the fourth plane mirror 24. This makes it possible to reduce the distance between the intermediate image and the third plane mirror 21 in the y-direction while the distance between the fourth plane mirror 24 and the substrate 3 in the y-direction remains the same. As a result, the distance between the intermediate image and the optical axis 103-104 of the second optical system can be set smaller than that between the optical axis 103-104 and the substrate 3. FIG. 1 illustrates an example in which both the second plane mirror 7 and the third plane mirror 21 are moved in the -y-direction.

However, the distance between the mask 1 and the substrate 3 in the z-direction can be reduced by moving at least one of the second plane mirror 7 and the third plane mirror 21 in the -y-direction, so the projection optical system PO and, eventually, the exposure apparatus can be downsized. In the above-mentioned relationship, let A be the distance from the mask 1 to the position of light reflection on the first plane mirror 5 in FIG. 1, and B be the distance from the position of light reflection on the second plane mirror 7 to the intermediate image in FIG. 1. Also, let C be the distance from the intermediate image to the position of light reflection on the third plane mirror 21 in FIG. 1, and D be the distance from the position of light reflection on the fourth plane mirror 24 to the substrate 3 in FIG. 1. To reduce the distance between the mask 1 and the substrate 3, the first to fourth plane mirrors and the first and second optical systems must be positioned so as to satisfy at least one of A>B and D>C. The position of each plane mirror does not adversely affect the optical performance of the projection optical system PO. When the above-mentioned condition is satisfied, it is possible to lower the height of the projection optical system PO without adversely affecting the performance of the projection optical system PO, thus downsizing the apparatus.

Second Embodiment

Figure 2:
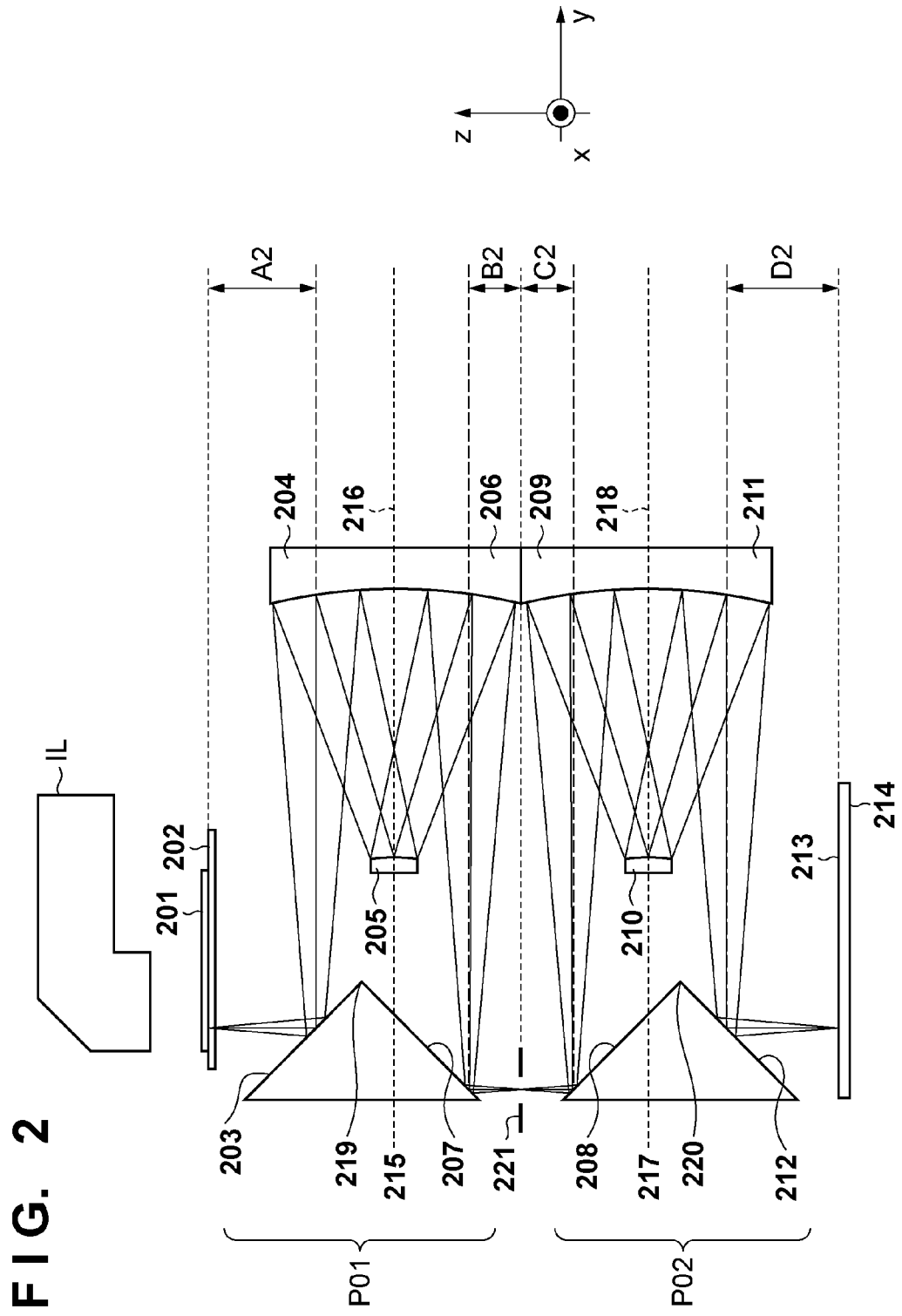
FIG. 2 is a view showing an exposure apparatus according to the second embodiment.

An exposure apparatus according to the second embodiment will be described with reference to FIG. 2. In the exposure apparatus in this embodiment, illumination light emitted by an illumination optical system IL passes through a mask 201 and a first plane mirror 203, is reflected by a first concave mirror 204, and passes through a first convex mirror 205 and a second concave mirror 206. The light is then reflected by a second plane mirror 207 to form an intermediate image at a position 221 conjugate to the mask 201. The first plane mirror 203 and second plane mirror 207 are integrated into a prism mirror so as to make a right angle with each other. After the reflected light forms an intermediate image, it is further reflected by a third plane mirror 208 included in a second reflecting optical system PO2. The reflected light passes through a third concave mirror 209, a second convex mirror 210, and a fourth concave mirror 211, and is reflected by a fourth plane mirror 212 to form an image on a substrate 213. The third plane mirror 208 and fourth plane mirror 212 included in the second reflecting optical system PO2 are integrated into a prism mirror so as to make a right angle with each other. A predetermined pattern for manufacturing a device is drawn on the mask 201, and an image which bears its information can be formed on the substrate 213. The mask 201 is fixed to a mask stage 202 capable of driving it. Also, the substrate 213 is fixed to a substrate stage 214 capable of driving it. A wider region can be exposed by scanning the mask stage 202 and substrate stage 214 in the y-direction in synchronism with each other.

Figure 5:
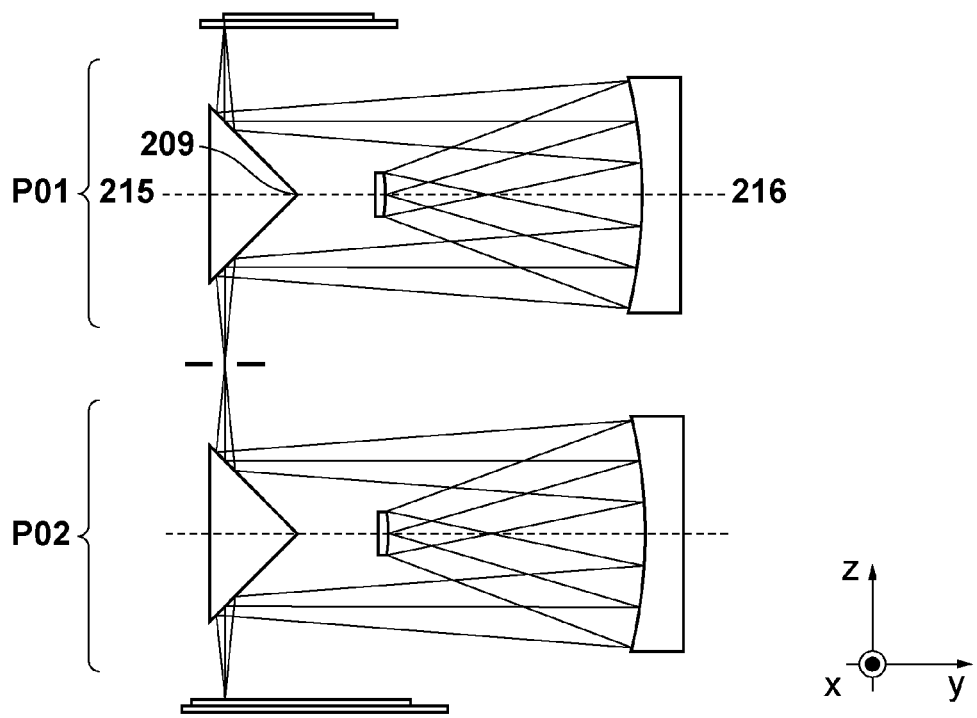
FIG. 5 is a view showing the conventional exposure apparatus.

A line 215-216 which connects the centers of curvature of the first convex mirror 205 and the pair of first and second concave mirrors 204 and 206 included in a first optical system to each other indicates the optical axis of the first optical system. Similarly, a line 217-218 which connects the centers of curvature of the second convex mirror 210 and the pair of third and fourth concave mirrors 209 and 211 included in a second optical system to each other indicates the optical axis of the second optical system. In the first embodiment, only the second plane mirror 7 close to the intermediate image is moved in the −y-direction to reduce the distance between the optical axis and the intermediate image. However, in the second embodiment, because two plane mirrors: the first and second plane mirrors 203 and 207 are integrated into a prism mirror, it is impossible to move only the second plane mirror 207 close to the intermediate image. Hence, a vertex 219 of the prism mirror formed by the first and second plane mirrors 203 and 207 included in a first reflecting optical system PO1 is moved in the z- and −y-directions relative to the optical axis 215-216, as shown in FIG. 2. This makes it possible to reduce the distance from the second plane mirror 207 to the intermediate image while the distance between the mask stage 202 and the first concave mirror 204 remains the same, without adversely affecting the optical performance of the reflecting optical system. Note that the vertex 219 of the prism mirror formed by the first and second plane mirrors 203 and 207 included in the first reflecting optical system of the exposure apparatus according to the related art technique is located on the optical axis 215-216 of the first optical system, as shown in FIG. 5.

Similarly, a vertex 220 of a prism mirror formed by the third and fourth plane mirrors 208 and 212 in the second reflecting optical system PO2 is moved in the −y- and −z-directions relative to the optical axis 217-218. This makes it possible to reduce the distance between the intermediate image and the third plane mirror 208 in the z-direction without adversely affecting the performance of the reflecting optical system and the scanning of the substrate stage 214. Let A2 be the distance from the mask 201 to the position of reflection on the first plane mirror 203, and B2 be the distance from the position of reflection on the second plane mirror 207 to the intermediate image. Also, let C2 be the distance from the intermediate image to the position of reflection on the third plane mirror 208, and D2 be the distance from the position of reflection on the fourth plane mirror 212 to the substrate 213. To reduce the distance between the mask 201 and the substrate 213 in the z-direction, A2>B2 or D2>C2 must be satisfied. When this condition is satisfied, it is possible to lower the height of a projection optical system PO without adversely affecting the performance of the projection optical system PO, thus downsizing the apparatus.

Third Embodiment

Figure 3:
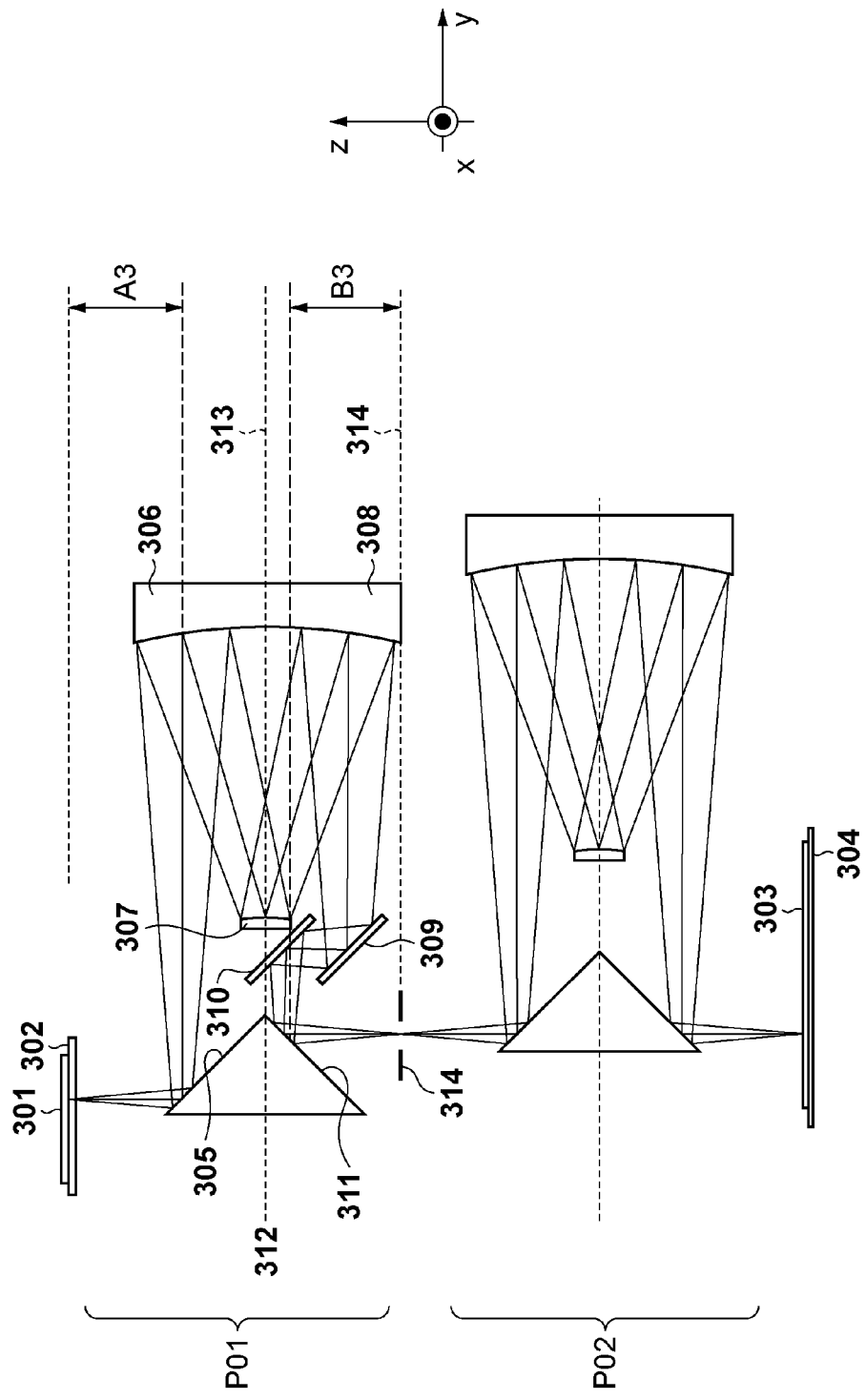
FIG. 3 is a view showing an exposure apparatus according to the third embodiment.

An exposure apparatus according to the third embodiment will be described with reference to FIG. 3. Illumination light emitted by an illumination optical system (not shown) passes through a mask 301 to form an intermediate image at a position 314 conjugate to the mask 301 via a first reflecting optical system PO1, and then forms a mask pattern on a substrate 303 via a second reflecting optical system PO2. The mask 301 is held by a mask stage 302, and the substrate 303 is held by a substrate stage 304. A wider range can be exposed by scanning the mask stage 302 and substrate stage 304 in the y-direction in synchronism with each other. The first reflecting optical system PO1 includes a first plane mirror 305, first concave mirror 306, first convex mirror 307, second concave mirror 308, and second plane mirror 311. A first optical system in the third embodiment further includes a pair of plane mirrors 309 and 310 positioned between the second concave mirror 308 and the second plane mirror 311. The pair of plane mirrors 309 and 310 are positioned parallel to each other, and shift toward the object plane the position, in the z-direction (second direction), of light which is reflected by the second concave mirror 308 and is incident on the second plane mirror 311.

When the rotation direction about the x-axis is defined as $\omega x$ assuming the clockwise direction as positive, the plane mirror 309 is tilted by −45° in the $\omega x$-direction with respect to the x-z plane, and the plane mirror 310 is tilted by −45° in the $\omega x$-direction with respect to the x-z plane as well. Also, the plane mirror 310 is positioned parallel to the plane mirror 309, that is, tilted by −45° in the $\omega x$-direction with respect to the x-z plane. The second plane mirror 311 is positioned to make a right angle with the first plane mirror 305. A line 312-313 which connects the centers of curvature of the first convex mirror 307 and the pair of first and third concave mirrors 306 and 308 to each other indicates the optical axis of the first optical system. By positioning the pair of plane mirrors 309 and 310, the distance from the optical axis 312-313 to the intermediate image can be set smaller than that from the optical axis 312-313 to the mask 301. Referring to FIG. 3, let A3 be the distance from the mask 301 to the position of reflection on the first plane mirror 305, and B3 be the distance from the position of reflection on the second plane mirror 311 to the intermediate image. To reduce the distance between the mask 301 and the substrate 303 in the z-direction, A3>B3 must be satisfied.

Figure 4:
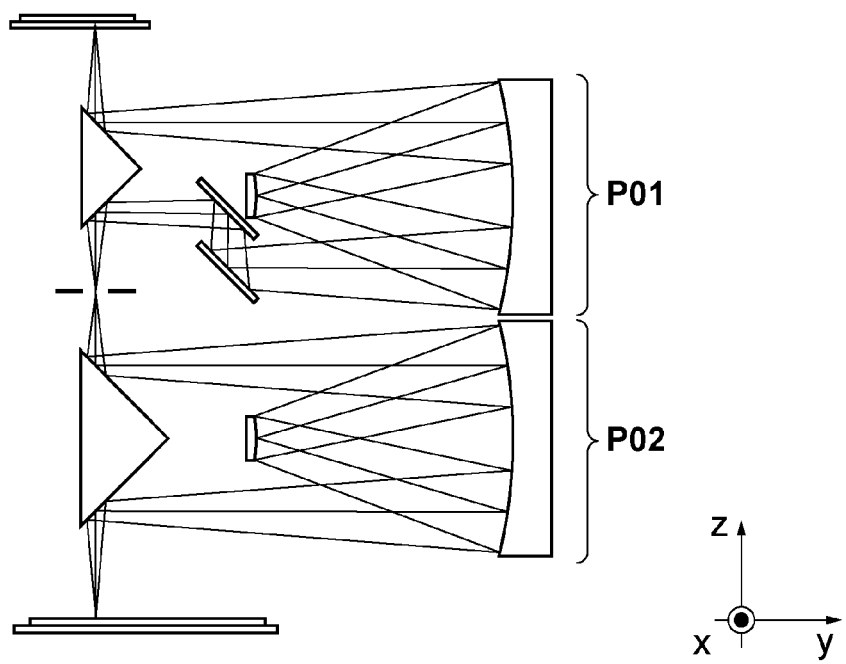
FIG. 4 is a view showing another exposure apparatus according to the third embodiment.

The methods described in the above-mentioned embodiments can be combined with each other, as shown in FIG. 4. Also, regardless of whether the present invention is applied to the first reflecting optical system PO1 or the second reflecting optical system PO2, the projection optical system PO can be downsized without adversely affecting the imaging performance of either reflecting optical system. Although an Offner system is employed as each of the first and second optical systems in this embodiment, it can also be used in combination with a Dyson optical system. The Offner system can also include a dioptric member between a mask and a concave mirror or between a concave mirror and a convex mirror.

Moreover, the first and second optical systems are not limited to unity magnification optical systems, and may be reduction systems or enlargement systems.

[Method of Manufacturing Device]

A method of manufacturing a device according to an embodiment of the present invention is suitable for manufacturing a device such as a semiconductor device or an FPD. This method can include a step of exposing a substrate coated with a photoresist to light using the above-mentioned exposure apparatus, and a step of developing the exposed substrate. This method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-183079 filed Aug. 24, 2011, which is hereby incorporated by reference herein in its entirety.

What is claimed is:

1. A projection optical system comprising:
    a unity magnification, first reflecting optical system that forms an intermediate image of an object positioned on an object plane; and
    a unity magnification, second reflecting optical system that projects the intermediate image onto an image plane,
    wherein the unity magnification, first reflecting optical system comprises:
        a first mirror that reflects light emitted from the object plane and is incident thereon upon traveling in a first direction perpendicular to the object plane;
        a first optical system that reflects the light from the first mirror; and
        a second mirror that reflects the light from the first optical system, in the first direction toward a forming position of the intermediate image, and
    wherein the unity magnification, second reflecting optical system comprises:
        a third mirror that reflects light emitted from the forming position of the intermediate image and is incident thereon upon traveling in the first direction;
        a second optical system that reflects the light from the third mirror; and
        a fourth mirror that reflects the light from the second optical system, in the first direction toward the image plane,
    wherein the first optical system comprises a first concave mirror, a first convex mirror, and a second concave mirror in order from a side of the first mirror in an optical path between the first mirror and the second mirror,
    wherein the second optical system comprises a third concave mirror, a second convex mirror, and a fourth concave mirror in order from a side of the third mirror in an optical path between the third mirror and the fourth mirror, and
    wherein the first mirror, the second mirror, the third mirror, the fourth mirror, the first optical system, and the second optical system are positioned to satisfy at least one of a condition in which a distance in the first direction between a position of reflection of the light on the second mirror and the forming position of the intermediate image is smaller than a distance in the first direction between a position of reflection of the light on the first mirror and the object plane and a distance in a second direction perpendicular to the first direction between the position of reflection of the light on the second mirror and the second concave mirror is larger than a distance in the second direction between the position of reflection of the light on the first mirror and the first concave mirror, or a condition in which a distance in the first direction between a position of reflection of the light on the third mirror and the forming position of the intermediate image is smaller than a distance in the first direction between a position of reflection of the light on the fourth mirror and the image plane and a distance in the second direction between the position of reflection of the light on the third mirror and the third concave mirror is larger than a distance in the second direction between the position of reflection of the light on the fourth mirror and the fourth concave mirror.

2. The system according to claim 1, wherein at least one of a pair of the first mirror and the second mirror or a pair of the third mirror and the fourth mirror are formed integrally.

3. An exposure apparatus of exposing a substrate positioned on the image plane to light by projecting a pattern of an original positioned on the object plane onto the substrate using a projection optical system defined in claim 1.

4. A projection optical system comprising:
    a unity magnification, first reflecting optical system that forms an intermediate image of an object positioned on an object plane; and
    a unity magnification, second reflecting optical system that projects the intermediate image onto an image plane,
    wherein the unity magnification, first reflecting optical system comprises:
        a first mirror that reflects light emitted from the object plane and is incident thereon upon traveling in a first direction perpendicular to the object plane;
        a first optical system that reflects the light from the first mirror; and
        a second mirror that reflects the light from the first optical system, in the first direction toward a forming position of the intermediate image, and
    wherein the unity magnification, second reflecting optical system comprises:
        a third mirror that reflects light emitted from the forming position of the intermediate image and is incident thereon upon traveling in the first direction;
        a second optical system that reflects the light from the third mirror; and
        a fourth mirror that reflects the light from the second optical system, in the first direction toward the image plane,
    wherein the first optical system comprises a first concave mirror that reflects the light from the first mirror to the second mirror,
    wherein the second optical system comprises a second concave mirror that reflects the light from the third mirror to the fourth mirror, and
    wherein the first mirror, the second mirror, the third mirror, the fourth mirror, the first optical system, and the second optical system are positioned to satisfy at least one of a condition in which a distance in the first direction between a position of reflection of the light on the second mirror and the forming position of the intermediate image is smaller than a distance in the first direction between a position of reflection of the light on the first mirror and the object plane and a distance in a second direction perpendicular to the first direction between the position of reflection of the light on the second mirror and the first concave mirror is larger than a distance in the second direction between the position of reflection of the light on the first mirror and the first concave mirror, or a condition in which a distance in the first direction between a position of reflection of the light on the third mirror and the forming position of the intermediate image is smaller than a distance in the first direction between a position of reflection of the light on the fourth mirror and the image plane and a distance in the second direction between the position of reflection of the light on the third mirror and the second concave mirror is larger than a distance in the second direction between the position of reflection of the light on the fourth mirror and the second concave mirror.

5. The system according to claim 4, wherein at least one of a pair of the first mirror and the second mirror or a pair of the third mirror and the fourth mirror are formed integrally.

6. An exposure apparatus exposing a substrate positioned on the image plane to light by projecting a pattern of an original positioned on the object plane onto the substrate using a projection optical system defined in claim 4.

7. A method of manufacturing a device, the method comprising the steps of:

exposing a substrate using an exposure apparatus;

developing the exposed substrate; and processing the developed substrate to manufacture the device, wherein the exposure apparatus exposes the substrate positioned on an image plane to light by projecting a pattern of an original positioned on an object plane onto the substrate using a projection optical system, wherein the projection optical system comprises:

a unity magnification, first reflecting optical system that forms an intermediate image of an object positioned on the object plane; and a unity magnification, second reflecting optical system that projects the intermediate image onto the image plane, wherein the unity magnification, first reflecting optical system comprises:

a first mirror that reflects light emitted from the object plane and is incident thereon upon traveling in a first direction perpendicular to the object plane;

a first optical system that reflects the light from the first mirror; and a second mirror that reflects the light from the first optical system, in the first direction toward a forming position of the intermediate image, wherein the unity magnification, second reflecting optical system comprises:

a third mirror that reflects light emitted from the forming position of the intermediate image and is incident thereon upon traveling in the first direction;

a second optical system that reflects the light from the third mirror; and a fourth mirror that reflects the light from the second optical system, in the first direction toward the image plane, wherein the first optical system comprises a first concave mirror, a first convex mirror, and a second concave mirror in order from a side of the first mirror in an optical path between the first mirror and the second mirror, wherein the second optical system comprises a third concave mirror, a second convex mirror, and a fourth concave mirror in order from a side of the third mirror in an optical path between the third mirror and the fourth mirror, and wherein the first mirror, the second mirror, the third mirror, the fourth mirror, the first optical system, and the second optical system are positioned so as to satisfy at least one of a condition in which a distance in the first direction between a position of reflection of the light on the second mirror and the forming position of the intermediate image is smaller than a distance in the first direction between a position of reflection of the light on the first mirror and the object plane and a distance in a second direction perpendicular to the first direction between the position of reflection of the light on the second mirror and the second concave mirror is larger than a distance in the second direction between the position of reflection of the light on the first mirror and the first concave mirror, or a condition in which a distance in the first direction between a position of reflection of the light on the third mirror and the forming position of the intermediate image is smaller than a distance in the first direction between a position of reflection of the light on the fourth mirror and the image plane and a distance in the second direction between the position of reflection of the light on the third mirror and the third concave mirror is larger than a distance in the second direction between the position of reflection of the light on the fourth mirror and the fourth concave mirror.

8. A method of manufacturing a device, the method comprising the steps of:

exposing a substrate using an exposure apparatus;

developing the exposed substrate; and processing the developed substrate to manufacture the device, wherein then exposure apparatus exposes a substrate positioned on an image plane to light by projecting a pattern of an original positioned on an object plane onto the substrate using a projection optical system, wherein the projection optical system comprises:

a unity magnification, first reflecting optical system that forms an intermediate image of an object positioned on the object plane; and a second reflecting optical system that projects the intermediate image onto the image plane, wherein the unity magnification, first reflecting optical system comprises:

a first mirror that reflects light emitted from the object plane and is incident thereon upon traveling in a first direction perpendicular to the object plane;

a first optical system that reflects the light from the first mirror; and a second mirror that reflects the light from the first optical system, in the first direction toward a forming position of the intermediate image, wherein the unity magnification, second reflecting optical system comprises:

a third mirror that reflects light emitted from the forming position of the intermediate image and is incident thereon upon traveling in the first direction;

a second optical system that reflects the light from the third mirror; and a fourth mirror that reflects the light from the second optical system, in the first direction toward the image plane, wherein the first optical system comprises a first concave mirror that reflects the light from the first mirror to the second mirror, wherein the second optical system comprises a second concave mirror that reflects the light from the third mirror to the fourth mirror, and wherein the first mirror, the second mirror, the third mirror, the fourth mirror, the first optical system, and the second optical system are positioned to satisfy at least one of a condition in which a distance in the first direction between a position of reflection of the light on the second mirror and the forming position of the intermediate image is smaller than a distance in the first direction between a position of reflection of the light on the first mirror and the object plane and a distance in a second direction perpendicular to the first direction between the position of reflection of the light on the second mirror and the first concave mirror is larger than a distance in the second direction between the position of reflection of the light on the first mirror and the first concave mirror, or a condition in which a distance in the first direction between a position of reflection of the light on the third mirror and the forming position of the intermediate image is smaller than a distance in the first direction between a position of reflection of the light on the fourth mirror and the image plane and a distance in the second direction between the position of reflection of the light on the third mirror and the second concave mirror is larger than a distance in the second direction between the position of reflection of the light on the fourth mirror and the second concave mirror.

* * * * *